United States Patent [19]

Dosaka et al.

[11] Patent Number: 4,907,199
[45] Date of Patent: Mar. 6, 1990

[54] DYNAMIC SEMICONDUCTOR MEMORY DEVICE AND METHOD FOR CONTROLLIG THE PRECHARGE/REFRESH AND ACCESS MODES THEREOF

[75] Inventors: Katsumi Dosaka; Masaki Kumanoya; Yasuhiro Konishi; Hiroyuki Yamasaki; Takahiro Komatsu, all of Hyogo, Japan

[73] Assignee: Mitsubishi Denki Kabushiki Kaisha, Tokyo, Japan

[21] Appl. No.: 271,489

[22] Filed: Nov. 15, 1988

[30] Foreign Application Priority Data

Jan. 14, 1988 [JP] Japan .................................. 63-7327

[51] Int. Cl.$^4$ ............................................. G11C 11/40
[52] U.S. Cl. ........................... 365/189.04; 365/230.03; 365/222; 365/203
[58] Field of Search ................... 365/230.03, 203, 222, 365/189.04

[56] References Cited

U.S. PATENT DOCUMENTS 4,725,987  2/1988  Cates ..................................... 365/222
4,730,279  3/1988  Ohtani ................................. 365/203

OTHER PUBLICATIONS

IEEE J. of Sol. St. Circuits: "A 288K CMOS Pseudostatic RAM", by H. Kawamoto et al., vol. SC-19, No. 5, Oct. 1984, pp. 619–623.
IEEE J. Of Sol. St. Circuits: "A Fast 256K×4 CMOS Dram with a Distributed Sense and Unique Restore Circuit", by H. Miyamoto et al., vol. SC-22, No. 5, Oct. '87, pp. 861–867.
LSI Res. & Dev. Lab: "A 64Kbit MOS Dynamic RAM with Auto, Self Refresh Functions", by M. Yamada et al., Mitsubishi Electric Corp., pp. 62–69.

Primary Examiner—Stuart N. Hecker
Assistant Examiner—Alfonso Garcia
Attorney, Agent, or Firm—Lowe, Price, LeBlanc, Becker & Shur

[57] ABSTRACT

A dynamic semiconductor memory device is divided into a plurality of blocks. An operation of the semiconductor memory device is in either of a normal mode and a refresh mode, depending on the level of a refresh signal. In the normal mode, at an off time period, a potential on a bit line pair is equalized and a precharge potential is applied to the bit line pair. At the access time, equalizing of the potential on the bit line pair and supply of the precharge potential are stopped in a selected block and then, a word line driving signal is raised. On the other hand, in the refresh mode, at the off time period, the potential on the bit line pair is held at "H" and "L" levels by a sense amplifier, so that the potential on the bit line pair is not equalized and the precharge potential is not supplied. On this occasion, a precharge potential generating circuit is electrically disconnected from a power supply. At the time of refresh operation, the sense amplifier is rendered inactive in the selected block, so that the potential on the bit line pair is equalized and then, the word line driving signal is raised.

12 Claims, 18 Drawing Sheets

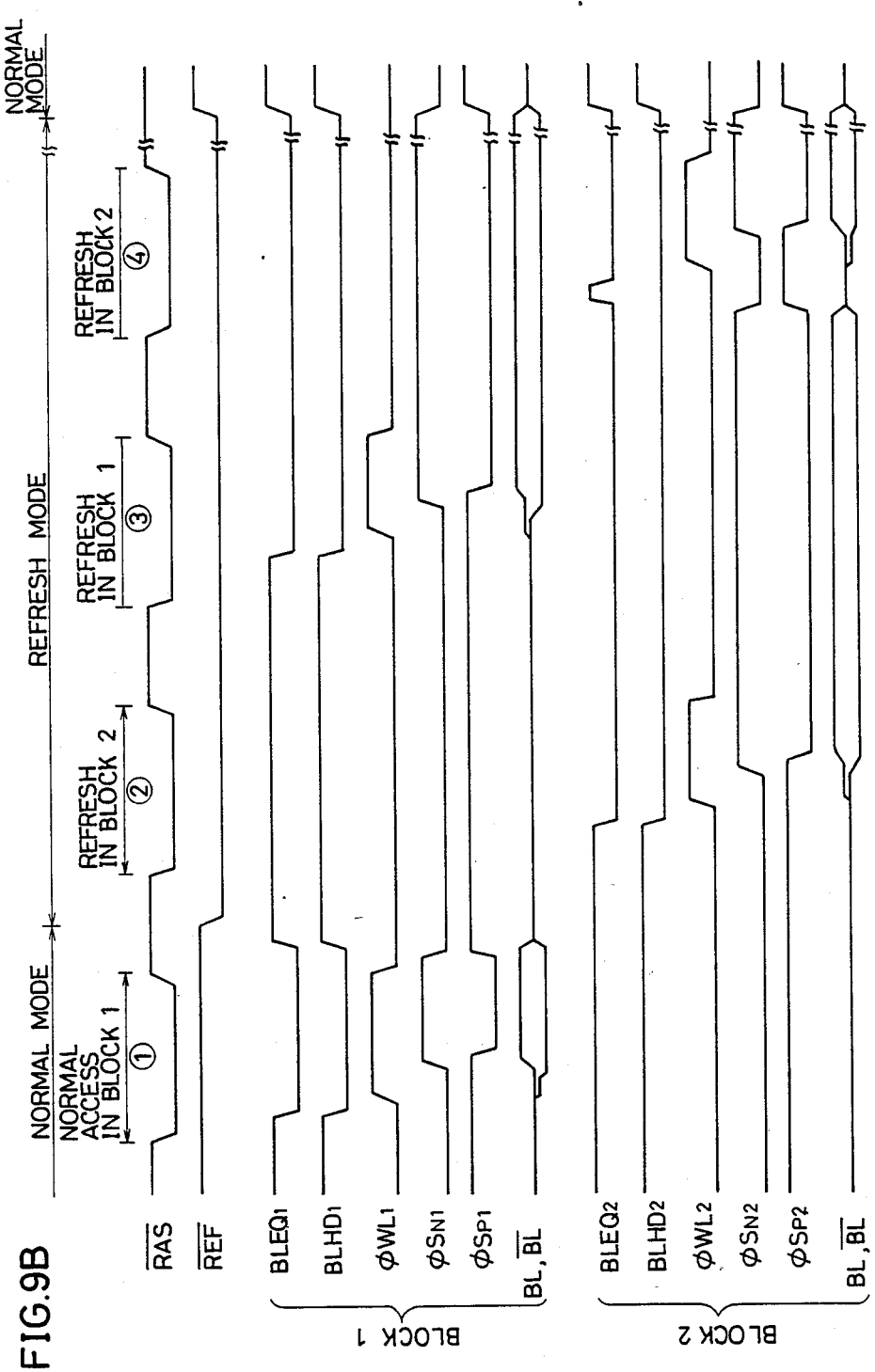

WHEN $\overline{RA8}$, i=1, WHEN $\overline{RA8}$, i=2

✳ WHEN RA8, i = 1 , WHEN $\overline{RA8}$, i = 2

DYNAMIC SEMICONDUCTOR MEMORY DEVICE AND METHOD FOR CONTROLLIG THE PRECHARGE/REFRESH AND ACCESS MODES THEREOF

BACKGROUND OF THE INVENTION

1. Field of the Invention

The present invention relates to a semiconductor memory device, and more particularly to a dynamic semiconductor memory device for performing an operation for dividing blocks and a method for controlling the same.

2. Description of the Prior Art

FIG. 1 is a diagram showing a part of a pair of bit lines in a conventional dynamic semiconductor memory device, which is described in an article entitled "A 288K CMOS Pseudostatic RAM", IEEE Journal of Solid-State Circuits, Vol SC-19, No. 5, Oct. 1984, pp. 619–623.

In FIG. 1, a plurality of word lines WL are arranged to intersect with a bit line pair BL and $\overline{BL}$, a memory cell MC being provided at an intersection of each of the bit lines BL and $\overline{BL}$ and each of the word lines WL. In FIG. 1, only a single memory cell MC connected to the bit line BL and a single memory cell MC connected to the bit line $\overline{BL}$ are illustrated and the other memory cells are omitted. Each of the memory cells MC comprises a transferring transistor Qs and a storing capacitor C. The transistor Qs is connected between the bit line BL or $\overline{BL}$ and the storing capacitor C and has its gate connected to the word line WL.

In addition, an N type sense amplifier NSA and a P type sense amplifier PSA are connected to the bit line pair BL and $\overline{BL}$. The N type sense amplifier NSA comprises N channel MOS transistors Q1 and Q2. The transistor Q1 is connected between the bit line $\overline{BL}$ and a node N1 and has its gate connected to the bit line BL. The transistor Q2 is connected between the bit line BL and the node N1 and has its gate connected to the bit line $\overline{BL}$. The node N1 is coupled to a ground potential through an N channel MOS transistor Q3. The transistor Q3 has its gate receiving a sense amplifier activating signal $\phi S_N$. The P type sense amplifier PSA comprises P channel MOS transistors Q4 and Q5. The transistor Q4 is connected between the bit line $\overline{BL}$ and a node N2 and has its gate connected to the bit line BL. The transistor Q5 is connected between the bit line BL and the node N2 and has its gate connected to the bit line $\overline{BL}$. The node N2 is coupled to a power-supply potential $V_{CC}$ through a P channel MOS transistor Q6. The transistor Q6 has its gate receiving a sense amplifier activating signal $\phi S_P$. In addition, an equalizing N channel MOS transistor Q7 is connected between the bit lines BL and $\overline{BL}$ and has its gate receiving an equalize signal BLEQ.

Referring to a waveform diagram of FIG. 2, description is made on operation of the circuit shown in FIG. 1.

When a row address strobe signal $\overline{RAS}$ is at an "H" level, i.e., in an off time period, the sense amplifier activating signal $\phi S_N$ attains the "H" level and the sense amplifier activating signal $\phi S_P$ attains an "L" level, so that the sense amplifiers NSA and PSA are rendered active. Consequently, a potential on one of the bit lines BL and $\overline{BL}$ is held at the "H" level and a potential on the other bit line is held at the "L" level.

Then, when the row address strobe signal $\overline{RAS}$ is at the "L" level, i.e., in an active period, the sense amplifier activating signal $\phi S_N$ is forced to be the "L" level and the sense amplifier activating signal $\phi S_P$ is forced to be the "H" level, so that the sense amplifiers NSA and PSA are rendered inactive. Thereafter, the equalize signal BLEQ is once forced to be the "H" level, so that the bit line pair BL and $\overline{BL}$ is short-circuited. Consequently, both the potentials on the bit lines BL and $\overline{BL}$ attain an intermediate potential (precharge potential) level between the "H" level and the "L" level. The equalize signal BLEQ is returned to the "L" level and then, a word line driving signal $\phi W_L$ rises to the "H" level. Consequently, information stored in the memory cell MC connected to the selected word line WL is read out to a corresponding bit line BL or $\overline{BL}$, so that a potential on the bit line BL or $\overline{BL}$ slightly rises or lowers in response to the information stored in the memory cell MC. On this occasion, a potential on the bit line BL or $\overline{BL}$ to which the selected memory cell MC is not connected remains at the above described precharge potential level. Thereafter, when the sense amplifier activating signal $\phi S_N$ is forced to be the "H" level and the sense amplifier activating signal $\phi S_P$ is forced to be the "L" level so that the sense amplifiers NSA and PSA are rendered active, the potential difference between the bit lines BL and $\overline{BL}$ is amplified. As a result, a higher potential of the potentials on the bit lines BL and $\overline{BL}$ is fixed at the "H" level and a lower potential is fixed at the "L" level. In the above described manner, refresh and read operations of the memory cell MC are performed. Thereafter, when the row address strobe signal $\overline{RAS}$ rises to the "H" level, the active period is completed, so that the word line driving signal $\phi WL$ falls to the "L" level. Consequently, a transistor Qs in the memory cell MC connected to the selected word line WL is turned off. However, the sense amplifiers NSA and PSA remain in an active state until the next active period is started. When the row address strobe signal $\overline{RAS}$ attains the "L" level so that the active period is started, the above described operations are performed again.

Meanwhile, in many cases, the recent dynamic semiconductor memory device has been adapted such that an operation for dividing a memory cell array is performed in order to decrease operating current. More specifically, the memory cell array is divided into a plurality of blocks, so that bit lines are charged or discharged only in a block selected by a part of inputted address signals.

When a memory cell array having structure shown in FIG. 1 is applied to a block partitioned semiconductor memory device, as shown in FIG. 2B, the row address strobe signal $\overline{RAS}$ falls to the "L" level and then, an address signal AD is decoded, so that a block is selected by the address signal AD. The equalize signal BLEQ in only the selected block rises to the "H" level, so that the potential on the bit line pair BL and $\overline{BL}$ is equalized. Thus, the equalize signal BLEQ cannot be forced to be the "H" level until the address signal AD has decoded after the row address strobe signal $\overline{RAS}$ fell to the "L" level, so that access is delayed. If the operation for dividing the memory cell array is not performed, a block need not be selected. Consequently, the equalize signal BLEQ can be raised to the "H" level immediately after the row address strobe signal $\overline{RAS}$ attains the "L" level, so that access is not delayed.

FIG. 3 is a diagram showing a part of one pair of bit lines in another conventional dynamic semiconductor memory device, which is described in, for example, an article entitled "A Fast 256K×4 CMOS DRAM with a Distributed Sense and Unique Restore Circuit", IEEE Journal of Solid-State Circuits, Vol. SC-22, No. 5, October 1987, pp. 861–867.

A circuit shown in FIG. 3 is the same as the circuit shown in FIG. 1 except that bit lines BL and $\overline{BL}$ are connected to a precharge potential generating circuit PR through precharging N channel MOS transistors Q8 and Q9, respectively. The transistors Q8 and Q9 have their gates receiving an equalize signal BLEQ which is also applied to an equalizing transistor Q7. The precharge potential generating circuit PR generates a precharge potential $V_{BL}$. The precharge potential $V_{BL}$ is an intermediate potential $\frac{1}{2} \cdot V_{CC}$ between a power-supply potential $V_{CC}$ and a ground potential.

Referring now to a waveform diagram of FIG. 4, description is made on operation of the circuit shown in FIG. 3.

In the circuit, immediately after the refresh and read operations of a memory cell MC are completed so that a row address strobe signal $\overline{RAS}$ rises to the "H" level and then, a word line driving signal $\phi WL$ attains the "L" level, a sense amplifier activating signal $\phi S_N$ attains the "L" level and a sense amplifier activating signal $\phi S_P$ attains the "H" level, so that sense amplifiers NSA and PSA are rendered inactive. The equalize signal BLEQ immediately attains the "H" level, so that the bit line pair BL and $\overline{BL}$ is short-circuited. Thus, in a block partitioned semiconductor memory device using this circuit, when decoding of the address signal is completed, the equalize signal BLEQ in a selected block can be immediately forced to be the "L" level and the word line driving signal $\phi WL$ can be raised to the "H" level, so that access is never delayed.

In the above described operation, while the row address strobe signal $\overline{RAS}$ is at the "H" level, a potential on the bit line pair BL and $\overline{BL}$ is equalized to be a precharge potential at an intermediate potential level between the "H" level and the "L" level. However, if the time period during which the row address strobe signal $\overline{RAS}$ is at the "H" level is long, the potential on the bit line pair BL and $\overline{BL}$ deviates from the above describe precharge potential by the effect of a leak current or the like. In order to hold constant the potential on the bit line pair BL and $\overline{BL}$, the precharge potential generating circuit PR is required.

In FIG. 3, when the equalize signal BLEQ attains the "H" level, the transistor Q7 is turned on so that the potential on the bit line pair BL and $\overline{BL}$ is equalized and at the same time, the transistors Q8 and Q9 are turned on, so that the bit line pair BL and $\overline{BL}$ is connected to the precharge potential generating circuit PR. Consequently, the precharge potential $V_{BL}$ is supplied to the bit line pair BL and $\overline{BL}$, so that the potential on the bit line pair BL and $\overline{BL}$ is held constant.

FIG. 5 is a diagram showing an example of a precharge potential generating circuit, which is described in the same document as that describing the circuit shown in FIG. 3.

The precharge potential generating circuit PR comprises an enhancement type N channel MOS transistors Q11, Q12 and Q13, enhancement type P channel MOS transistors Q14, Q15 and Q16, and resistors R1 to R4 having the same resistance value. The resistor R1, the transistor Q11, the transistor Q12 and the resistor R2 are connected in series between a power-supply potential supplying portion V1 and a ground potential supplying portion V2. The transistor Q11 has its gate connected to a node N3 of the resistor R1 and the transistor Q11. The transistor Q12 has its gate connected to a node N4 of the transistors Q11 and Q12. In addition, the resistor R3, the transistor Q14, the transistor Q15 and the resistor R4 are connected in series between the power-supply potential supplying portion V1 and the ground potential supplying portion V2. The transistor Q14 has its gate connected to a node N5 of the transistors Q14 and Q15. The transistor Q15 has its gate connected to a node N6 of the transistor Q15 and the resistor R4. In addition, an output portion comprising the transistors Q13 and Q16 is connected between the power-supply potential supplying portion V1 and the ground potential supplying portion V2. The transistor Q13 is connected between the power-supply potential supplying portion V1 and an output portion 0 and has its gate connected to the node N3. The transistor Q16 is connected between the ground potential supplying portion V2 and the output portion 0 and has its gate connected to the node N6. The power-supply potential supplying portion V1 is coupled to a power-supply potential $V_{CC}$ and the ground potential supplying portion V2 is coupled to a ground potential.

Assuming that threshold voltages of the N channel MOS transistors Q11 to Q13 are represented by $V_{THN}$ (>0) and threshold voltages of the P channel MOS transistors Q14 to Q16 are represented by $V_{THP}$ (<0), a potential of the node N3 is $V_{CC}/2 + V_{THN}$ and a potential of the node N6 is $V_{CC}/2 + V_{THP}$. Consequently, when a potential of the output portion O is $V_{CC}/2$ or less, the transistor Q13 is rendered conductive and the transistor Q16 is rendered non-conductive, so that the potential of the output portion O is raised. On the other hand, when the potential of the output portion O is $V_{CC}/2$ or more, the transistor Q13 is rendered non-conductive and the transistor Q16 is rendered conductive, so that the potential of the output portion O is lowered.

Meanwhile, in the precharge potential generating circuit PR, current flows through a path comprising the power-supply potential supplying portion V1, the resistor R1, the transistor Q11, the transistor Q12, the resistor R2 and the ground potential supplying portion V2 and a path comprising the power-supply potential supplying portion V1, the resistor R3, the transistor Q14, the transistor Q15, the resistor R4 and the ground potential supplying portion V2. In addition, subthreshold current constantly flows through the transistors Q13 and Q16. Thus, current at the standby time is increased.

Recently, since a portable personal computer has been widely used, storage is held by a buttery also in a dynamic semiconductor memory device. Thus, current required to hold storage must be decreased. In the dynamic semiconductor memory device, the semiconductor memory device generally enters a standby state and a refresh operation is performed the minimum of times as required, so that storage is held. Thus, in order to decrease the current required to hold storage, either or both of standby current and refresh current must be decreased. However, constant current flowing through the above described precharge potential generating circuit causes both the standby current and the refresh current to be increased.

In the conventional block partitioned semiconductor memory device shown in FIGS. 1 and 2, the bit line pair of BL and $\overline{BL}$ must be equalized after address decoding is completed as described above, so that access is delayed. In addition, in the conventional block partitioned semiconductor memory device shown in FIGS. 3 and 4, the constant current flowing through the precharge potential generating circuit causes the current at the time of the operation and the current required to hold storage to be increased.

SUMMARY OF THE INVENTION

An object of the present invention is to provide a block partitioned dynamic semiconductor memory device in which access is not delayed in a normal cycle and current at the time of an operation and current required for holding storage are decreased.

Another object of the present invention is to provide a method for controlling a block partitioned dynamic semiconductor memory with high speed access and reduced current.

In order to attain the above described object, a semiconductor memory device according to the present invention comprises a memory cell array divided into a plurality of blocks, each of the blocks comprising a plurality of memory cells arranged in a plurality of rows and columns, a plurality of word lines each provided corresponding to each of the rows of the plurality of memory cells and used for selecting the memory cells in the row, a plurality of bit line pairs each provided corresponding to each of the columns of the plurality of memory cells and used for writing information to the memory cells in the column or reading out information stored in the memory cells in the column, a plurality of sense amplifiers each connected to each of the bit line pairs for amplifying potentials on the bit lines to a first potential and a second potential, respectively, and a plurality of equalizing means each connected to each of the bit line pairs for equalizing a potential on the bit line pair.

The semiconductor memory device further comprises block selecting means for selecting any of the plurality of blocks, intermediate potential generating means for generating an intermediate potential between the first potential and the second potential and applying the same to each of the bit line pairs, mode defining means for providing a first mode control signal defining a normal mode and a second mode control signal defining a refresh mode; and control means.

The control means is responsive to the first mode control signal defining a normal mode for (a) rendering inactive the sense amplifiers included in a block selected by the block selecting means; and (b) rendering active the equalizing means and the intermediate potential generating means included in the selected block after an access operation in the block is completed. The control means is further responsive to the second mode control signal defining a refresh mode for, prior to starting of the refresh mode (a) holding active the sense amplifiers included in a block selected by the block selecting means and rendering inactive the equalizing means and the intermediate potential generating means included in the selected block after a refresh operation in the block is completed; and (b) rendering inactive the sense amplifiers included in the block immediately before the next refresh operation is performed in the block, rendering the equalizing means active for a predetermined short period of time.

At the time of the normal mode, since the potential on the bit line pair is equalized and the intermediate potential is supplied in an off time period, the potential on each bit line is held at the intermediate potential level. Thus, at the time of an access operation, equalizing of the potential on the bit line pair and supply of the intermediate potential are immediately stopped to select a row to be accessed, in the block selected by the block selecting means. Consequently, access is made at a high speed.

On the other hand, at the time of the refresh mode, the potential on the bit line pair is held at the first potential and the second potential during the off time period, so that the potential on the bit line pair is not equalized and the intermediate potential is not supplied. On this occasion, since the intermediate potential generating means is rendered inactive, so that the power consumption is reduced. In this case, at the time of the refresh operation, the sense amplifier is rendered inactive in the block selected by the block selecting means and then, the potential on the bit line pair is equalized. Consequently, a row to be refreshed is selected.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 9B is an enlarged view of a main portion of FIG. 9A;

DESCRIPTION OF THE PREFERRED EMBODIMENTS

Figure 1:
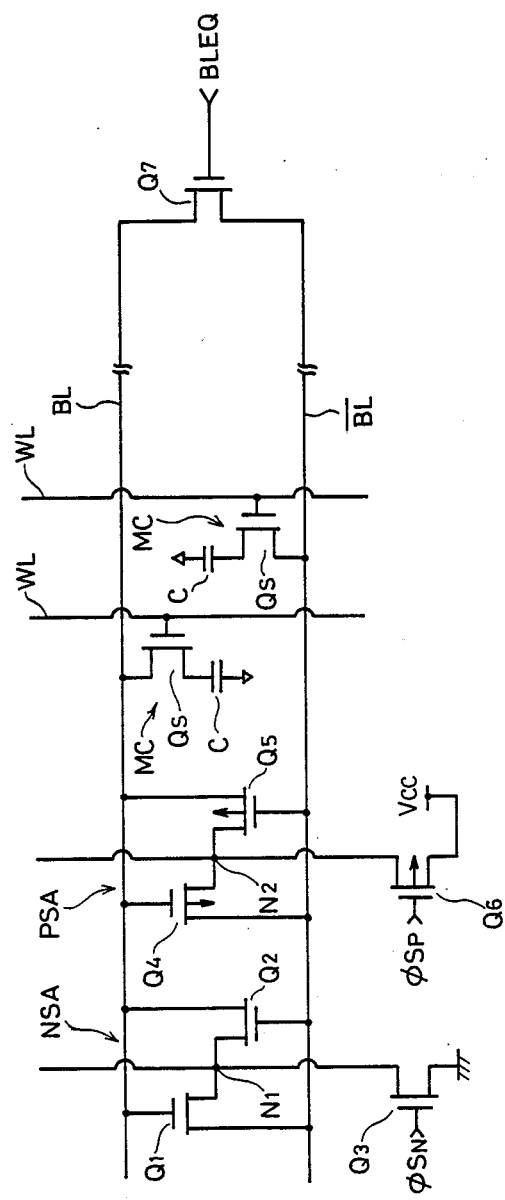
FIG. 1 is a diagram showing circuit structure of one column in a memory cell array included in a conventional dynamic semiconductor memory device.

Referring now to the drawings, description is made on an embodiment of the present invention.

Figure 2A:
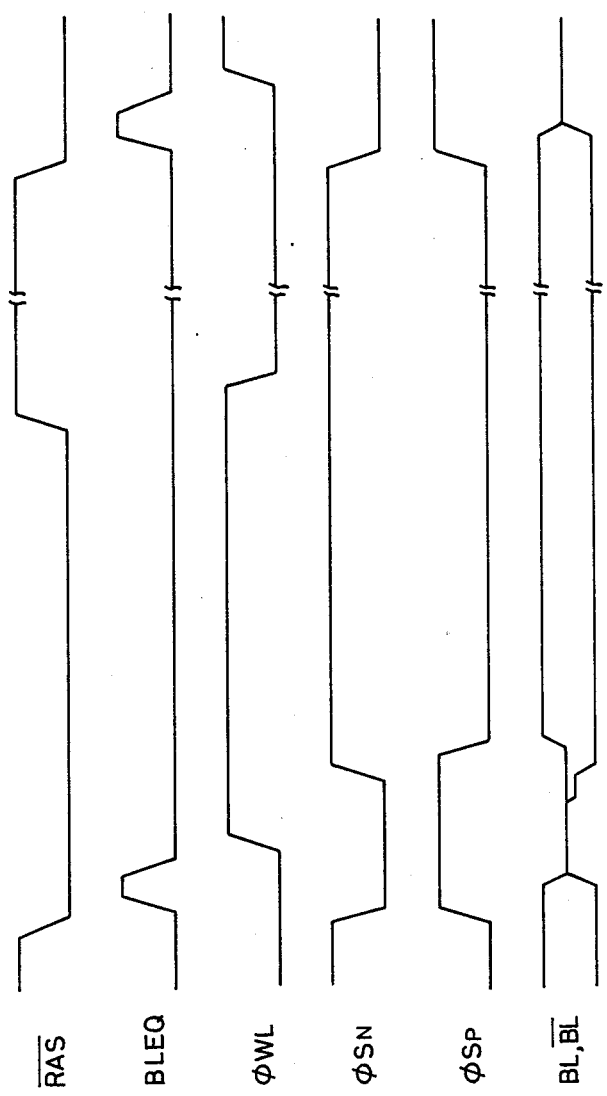
FIG. 2A is a waveform diagram for explaining operation of a semiconductor memory device shown in FIG. 1.
Figure 2B:
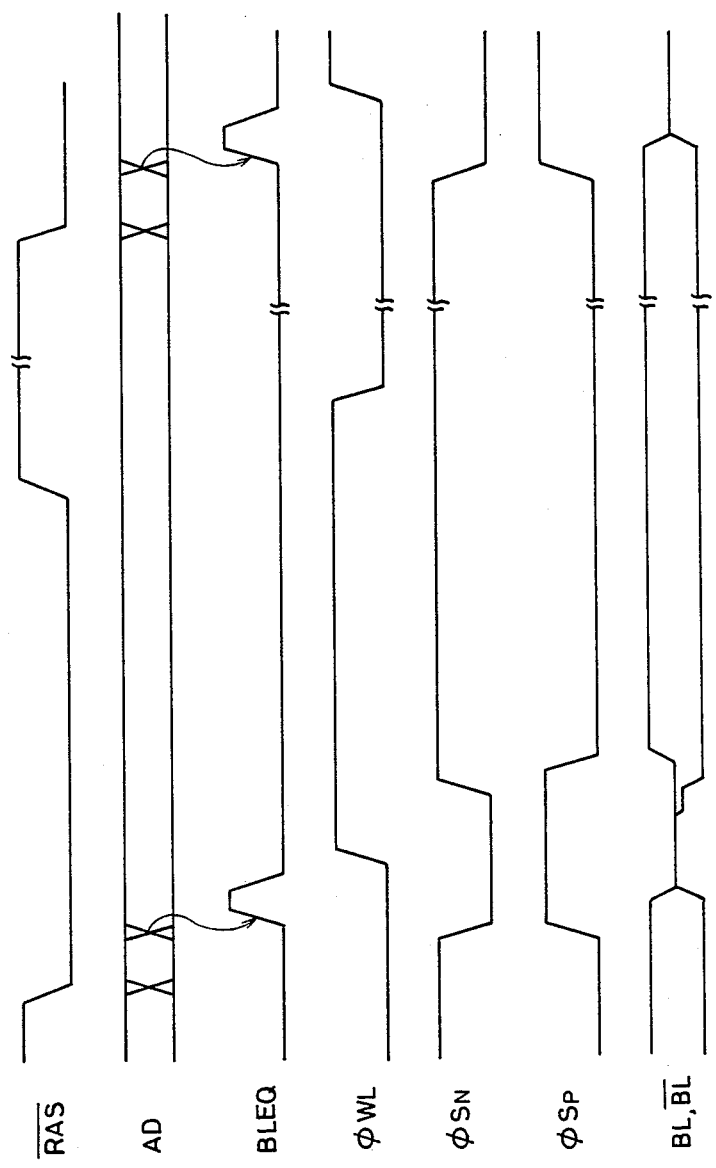
FIG. 2B is a waveform diagram for explaining operation when a memory cell array having structure shown in FIG. 1 is applied to a block partitioned semiconductor memory device.
Figure 4:
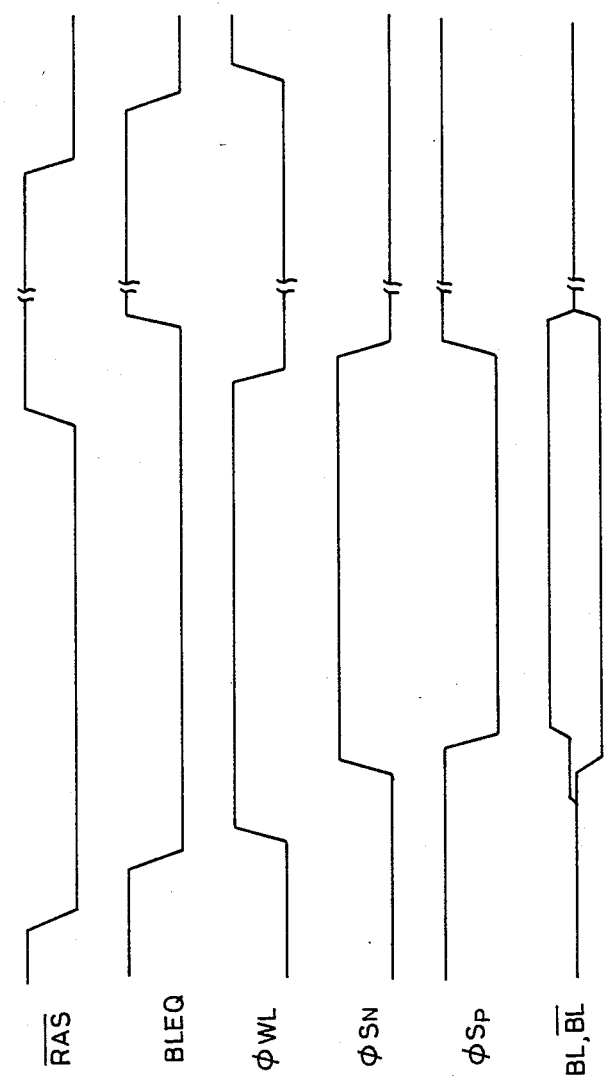
FIG. 4 waveform diagram for explaining operation of the device shown in FIG. 5.

In the embodiment, the same operation as that shown in FIG. 2B is performed in a refresh cycle while the same operation as that shown in FIG. 4 is performed in a normal access cycle.

Figure 6:
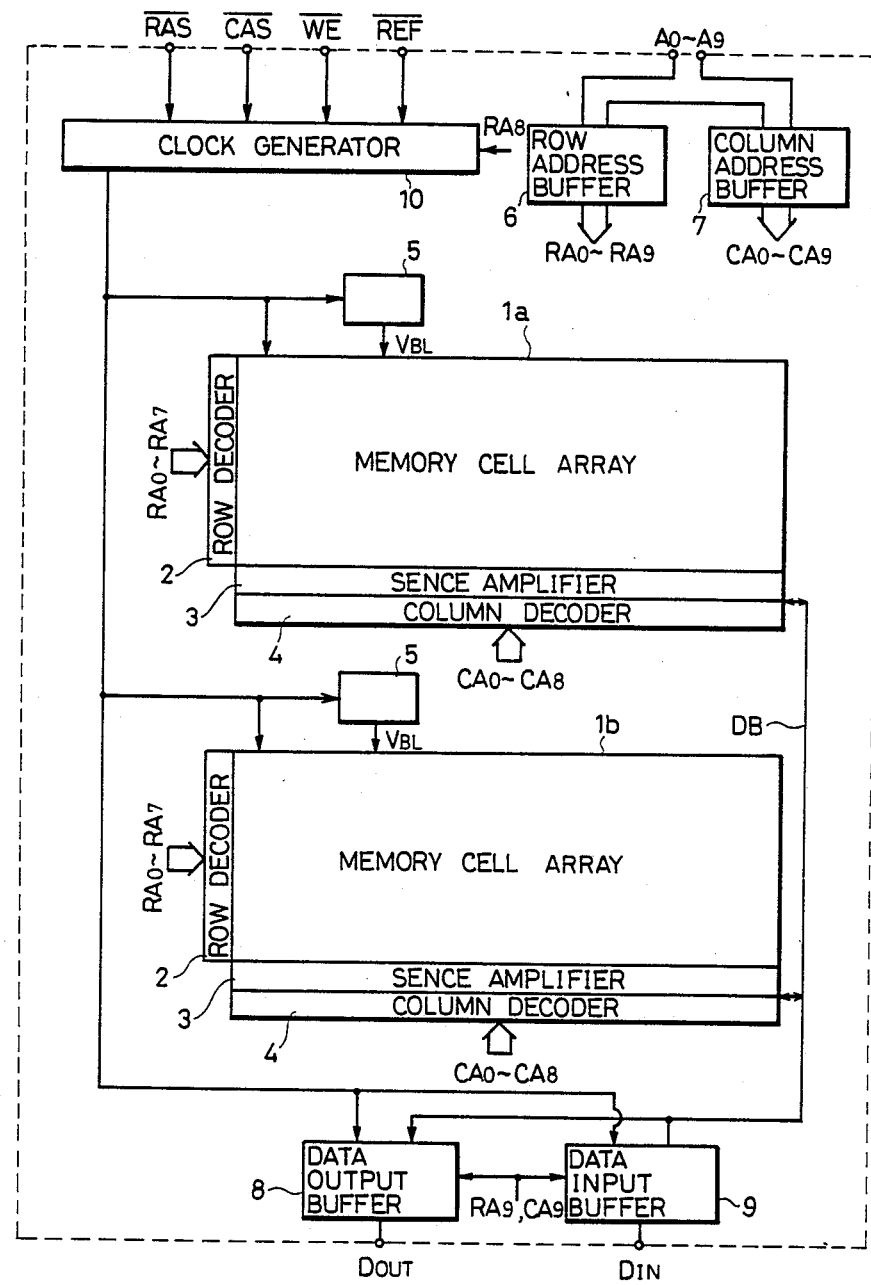
FIG. 6 is a diagram showing structure of a dynamic semiconductor memory device according to an embodiment of the present invention.

FIG. 6 is a diagram showing structure of a block partitioned semiconductor memory device according to the embodiment of the present invention.

In FIG. 6, memory cell arrays 1a and 1b each comprise a plurality of memory cells arranged in a plurality of rows and columns. Each of the memory cell arrays 1a and 1b is provided with a row decoder 2, a sense amplifier 3, a column decoder 4 and a precharge potential generating circuit 5. On the other hand, address signals $A_0$ to $A_9$ are applied to a row address buffer 6 and a column address buffer 7 from the exterior in a time divisional manner. The row address buffer 6 generates row address signals $RA_0$ to $RA_9$ from the address signals $A_0$ to $A_9$. The column address buffer 7 generates column address signals $CA_0$ to $CA_9$ from the address signals $A_0$ to $A_9$. The row decoder 2 is responsive to the row address signals $RA_0$ to $RA_7$ for selecting one row in each of the memory cell arrays 1a and 1b. The sense amplifier 3 senses and amplifies information read out from memory cells in the selected one row. The column decoder 4 is responsive to the column address signals $CA_0$ to $CA_8$ for selecting four columns in each of the memory cell arrays 1a and 1b.

At the time of a read operation, information stored in four memory cells selected by the row decoder 2 and the column decoder 4 are applied to a data output buffer 8 through a data bus DB. The data output buffer 8 is responsive to the row address signal $RA_9$ and the column address signal $CA_9$ for selecting one of four information and outputting the same as output data $D_{OUT}$.

At the time of a write operation, four memory cells are selected by the row decoder 2 and the column decoder 4 and input data $D_{IN}$ is applied to a data input buffer 9. The data input buffer 9 is responsive to the row address signal $RA_9$ and the column address signal $CA_9$ for applying the input data $D_{IN}$ to one of the four memory cells through the data bus DB. The read or write operation is selected by a write enable signal $\overline{WE}$. When the write enable signal $\overline{WE}$ is at an "H" level, the read operation is performed. When it is at an "L" level, the write operation is performed.

A clock generator 10 is responsive to a row address strobe signal $\overline{RAS}$, a column address strobe signal $\overline{CAS}$, the write enable signal $\overline{WE}$, a refresh signal $\overline{REF}$ which are externally applied and a row address signal $RA_8$ applied from the row address buffer 6 for generating various clock signals. The clock signals cause an operation of each portion to be controlled.

Figure 7:
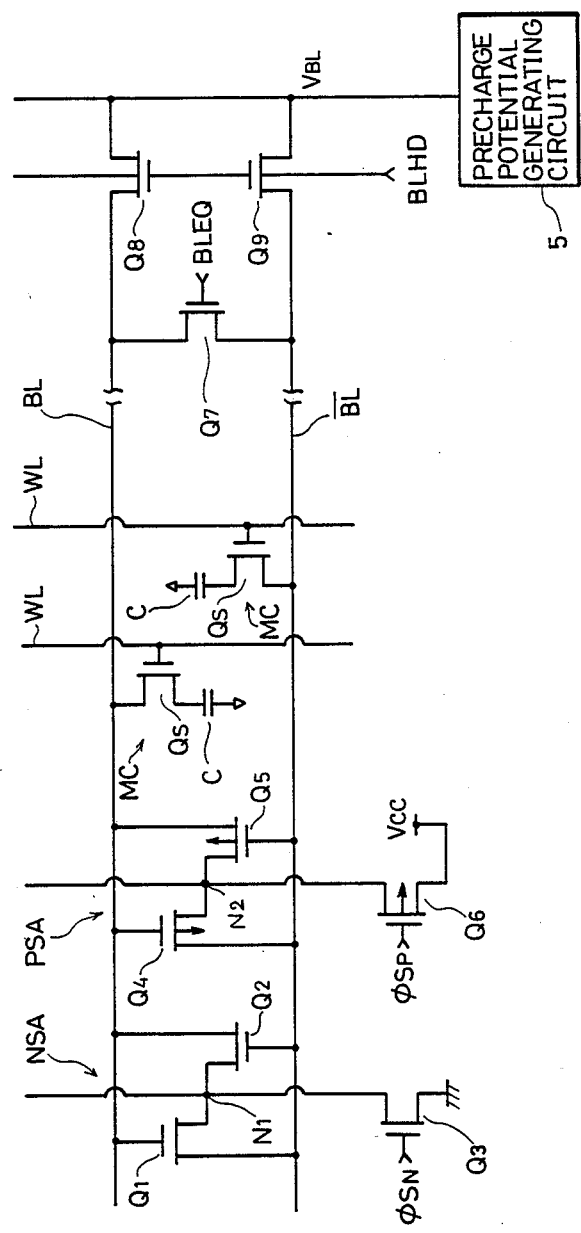
FIG. 7 is a diagram showing circuit structure of one column in a memory cell array included in the semiconductor memory device shown in FIG. 6.

FIG. 7 is a diagram showing specific circuit structure of a portion of one column in each of the memory cell arrays 1a and 1b.

Figure 3:
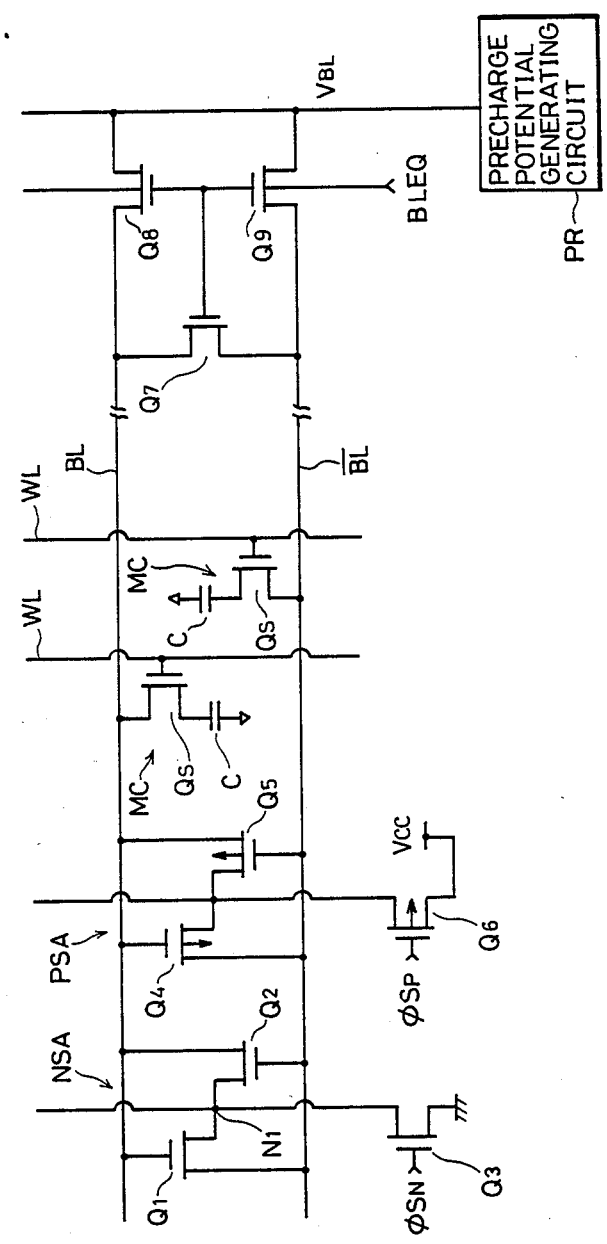
FIG. 3 diagram showing circuit structure of one column in a memory cell array included in another conventional d memory device.

In FIG. 7, a plurality of word lines WL are arranged to intersect with a bit line pair BL and $\overline{BL}$, a memory cell MC being provided at an intersection of each of the bit lines BL and $\overline{BL}$ and each of the word lines WL, just as in FIGS. 1 and 3. Also in FIG. 7, only a single memory cell MC connected to the bit line BL and only a single memory cell MC connected to the bit line $\overline{BL}$ are shown and the other memory cells are omitted. In addition, an N type sense amplifier NSA and a P type sense amplifier PSA are connected to the bit lines BL and $\overline{BL}$.

Additionally, an equalizing N channel MOS transistor Q7 is connected between the bit lines BL and $\overline{BL}$ and its gate receiving an equalize signal BLEQ. In addition, the bit lines BL and $\overline{BL}$ are connected to a precharge potential generating circuit 5 through N channel MOS transistors Q8 and Q9, respectively. The transistors Q8 and Q9 have their gates receiving a precharging signal BLHD.

Figure 5:
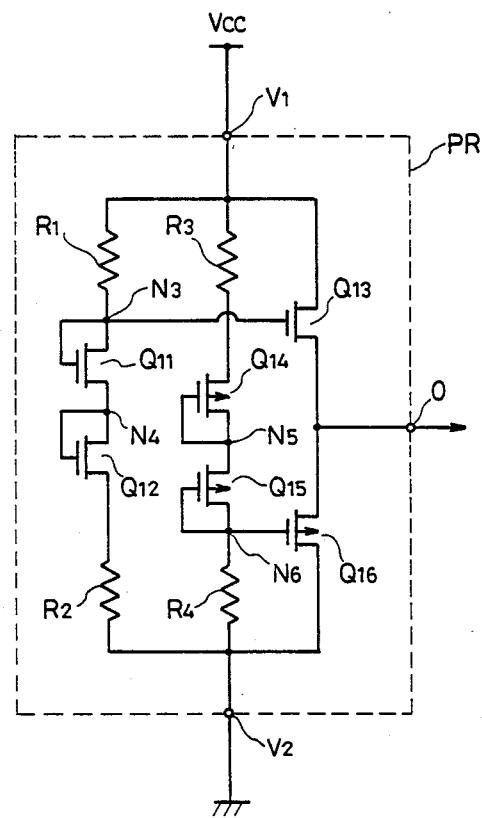
FIG. 5 is a diagram showing specific circuit structure of a precharge potential generating circuit.
Figure 8:
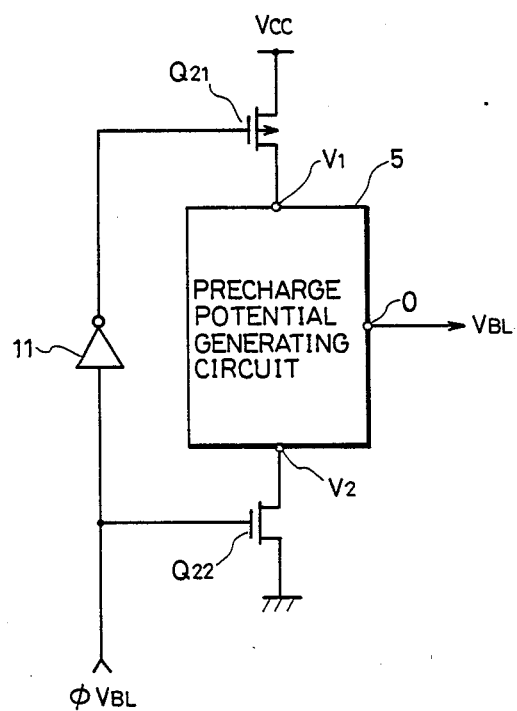
FIG. 8 is a diagram showing structure of a precharge potential generating circuit included in the semiconductor memory device shown in FIG. 6.

Circuit structure of the precharge potential generating circuit 5 is the same as that shown in FIG. 5. However, as shown in FIG. 8, the precharge potential generating circuit 5 has a power-supply potential supplying portion V1 coupled to a power-supply potential $V_{CC}$ through a P channel MOS transistor Q21 and has a ground potential supplying portion V2 coupled to a ground potential through an N channel MOS transistor Q22. The transistor Q22 has its gate receiving a control signal $\phi V_{BL}$. The transistor Q21 has its gate receiving a signal obtained by inverting the control signal $\phi V_{BL}$ by an inverter 11. The control signal $\phi V_{BL}$ may be a signal responsive to the precharging signal BLHD shown in FIG. 7 and may be the same signal as the precharging signal BLHD. When the control signal $\phi V_{BL}$ is at the "H" level, the precharge potential generating circuit 5 operates. On the other hand, when the control signal $\phi V_{BL}$ is at the "L" level, the precharge potential generating circuit 5 is electrically disconnected from a power supply not to operate.

Figure 9A:
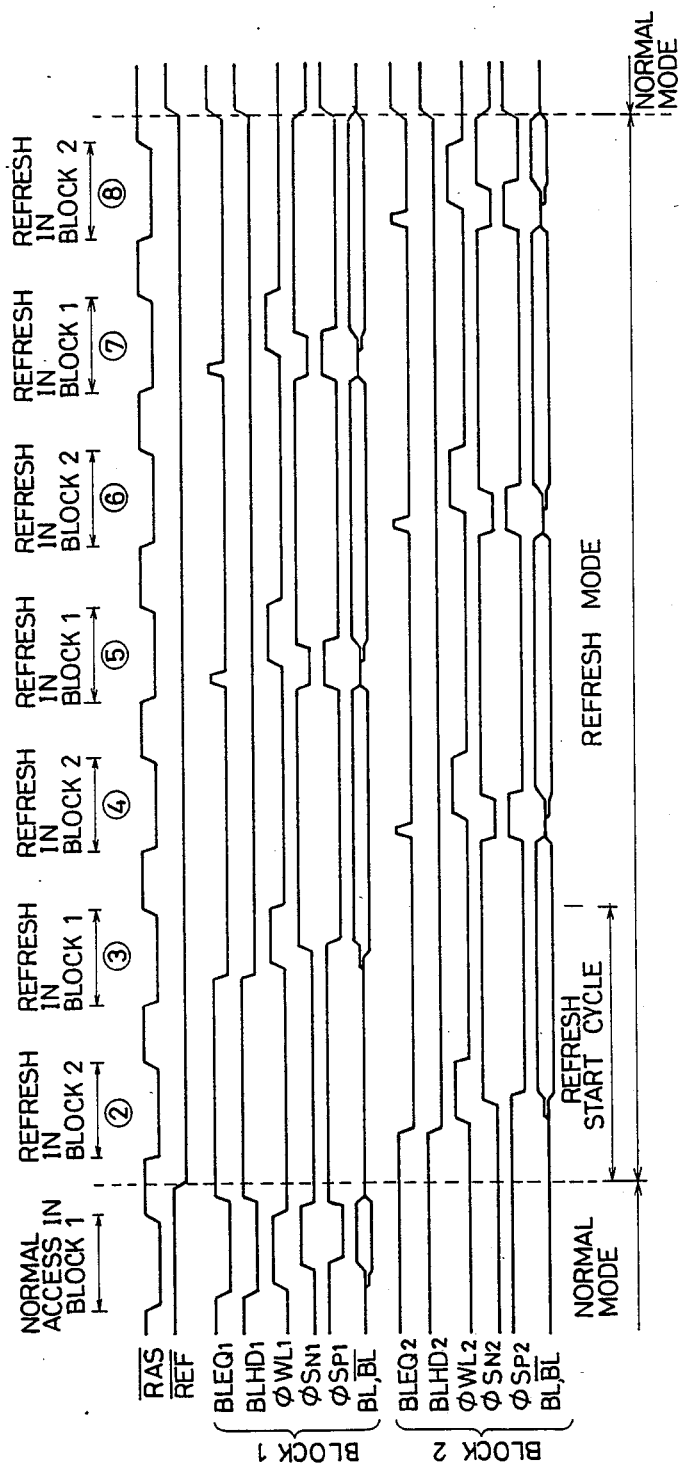
FIG. 9A is a waveform diagram for explaining operation of the semiconductor memory device shown in FIG. 6.

Referring now to a waveform diagram of FIGS. 9A and 9B, description is made on operation of the semiconductor memory device shown in FIG. 6. FIG. 9B is an enlarged view of a main portion of FIG. 9A.

It is assumed that the memory cell arrays 1a and 1b, shown in FIG. 6 are blocks 1 and 2, respectively. The operation of the semiconductor memory device is divided into operation in a normal mode and a refresh mode by a level of the refresh signal $\overline{REF}$ externally applied. In the normal mode, a read operation or a write operation of data is performed. In the refresh mode, a refresh operation is performed of reading out and writing again information stored in a storing capacitor C before the information disappears with the lapse of time.

In both the normal mode and the refresh mode, only the selected block operates. The block is selected by the row address signal $RA_8$.

When the refresh signal $\overline{REF}$ is at the "H" level, a normal mode is selected. It is assumed that normal access to the block 1 is made. In the standby period (off time period) during which the row address strobe signal $\overline{RAS}$ is at the "H" level, an equalize signal $BLEQ_1$ is at the "H" level so that potentials on the bit lines BL and $\overline{BL}$ are equalized to the same potential. In addition, a precharging signal $BLHD_1$ is at the "H" level. Consequently, the precharge potential generating circuit 5 operates and the transistors Q8 and Q9 are turned on, so that the precharge potential $V_{BL}$ is applied to the bit line pair BL and $\overline{BL}$. Thus, a potential on the bit line pair BL and $\overline{BL}$ is held at $\frac{1}{2} \cdot V_{CC}$ level. On this occasion, the sense amplifier activating signal $\phi S_{N1}$ attains the "L" level and the sense amplifier activating signal $\phi S_{P1}$ attains the "H" level, so that the sense amplifiers NSA and PSA are rendered inactive.

When the row address strobe signal $\overline{RAS}$ attains the "L" level so that the active period (the time period ①) is started, the equalize signal $BLEQ_1$ and the precharging signal $BLHD_1$ fall to the "L" level. Consequently, the transistor Q7 is turned off so that an equalize operation is completed, and the transistors Q8 and Q9 are turned off so that the bit line pair BL and $\overline{BL}$ is electrically disconnected from the precharge potential generating circuit 5. At the same time, the operation of the precharge potential generating circuit 5 is stopped. When a word line driving signal $\phi WL_1$ rises to the "H" level, a potential on a single word line WL selected by the row decoder 2 rises, so that a transferring transistor Qs in a memory cell MC connected to the word line WL is turned on. Consequently, information stored in the memory cell MC is read out on the bit line BL or $\overline{BL}$. Then, the sense amplifier activating signal $\phi S_{N1}$ attains the "H" level and the sense amplifier activating signal $\phi S_{P1}$ attains the "L" level, so that the sense amplifiers NSA and PSA are rendered active. When a read operation or a write operation is completed, the word line driving signal $\phi WL_1$ falls to the "L" level. Thereafter, the sense amplifier activating signal $\phi S_{N1}$ attains the "L" level and the sense amplifier activating signal $\phi S_{P1}$ attains the "H" level, so that the sense amplifiers NSA and PSA are rendered inactive. The equalize signal $BLEQ_1$ and the precharging signal $BLHD_1$ attain the "H" level, so that the potentials on the bit lines BL and $\overline{BL}$ are equalized and a precharge potential $V_{BL}$ is applied to the bit line pair BL and $\overline{BL}$.

As described above, in the standby period, the precharge potential $V_{BL}$ is applied to the bit line pair BL and $\overline{BL}$ from the precharge potential generating circuit 5. On this occasion, the sense amplifiers NSA and PSA are rendered inactive. Thus, immediately after a block is selected by the row address signal $RA_8$, the equalize signal BLEQ and the precharging signal BLHD can be lowered to the "L" level and the word line driving signal $\phi WL$ can be raised to the "H" level, so that access is never delayed.

When the refresh signal $\overline{REF}$ attains the "L" level, a refresh mode is selected. It is assumed that a block 2 is selected by the row address signal $RA_8$ (in the time period ②). In this case, an equalize signal $BLEQ_2$ and a precharging signal $BLHD_2$ fall to the "L" level in response to the fall of the row address strobe signal $\overline{RAS}$. Consequently, equalizing of the potentials on the bit lines BL and $\overline{BL}$ is stopped and the operation of the precharge potential generating circuit 5 is stopped. A word line driving signal $\phi WL_2$ attains the "H" level so that a potential on a single word line WL selected by the row decoder 2 rises to the "H" level. Consequently, word line WL is read out on the bit line BL or $\overline{BL}$. Thereafter, a sense amplifier activating signal $\phi S_{N2}$ rises to the "H" level and a sense amplifier activating signal $\phi S_{P2}$ tl falls to the "L" level, so that the sense amplifiers NSA and PSA are rendered active. Consequently, the potential difference between the bit lines BL and $\overline{BL}$ is amplified. The operation so far is the same as the operation in the normal mode. However, the word line driving signal $\phi WL_2$ falls to the "L" level so that information on the bit lines BL and $\overline{BL}$ are rewritten in the memory cells and then, an equalize signal $BLEQ_2$ and a precharging signal $BLHD_2$ remain at the "L" level. Thus, the potentials on the bit lines BL and $\overline{BL}$ are not equalized and the precharge potential $V_{BL}$ is not supplied to the bit line pair BL and $\overline{BL}$. In addition, the sense amplifiers NSA and PSA remain at an active state. Consequently, one of the bit lines BL and $\overline{BL}$ remains at the "H" level and the other remains at the "L" level.

Then, when the block 1 is selected by the row address signal $RA_8$, the same refresh operation as described above is performed in the block 1 (in the time period ③). After the refresh operation is completed, the potentials on the bit lines BL and $\overline{BL}$ are not equalized, the precharge potential $V_{BL}$ is not supplied to the bit line pair BL and $\overline{BL}$, and the sense amplifiers NSA and PSA remain at the active state, as in the block 2.

Then, when the block 2 is selected by the row address signal $RA_8$ (in the time period ④), the sense amplifier activating signal $\phi S_{N2}$ attains the "L" level and the sense amplifier activating signal $\phi S_{P2}$ attains the "H" level in response to the fall of the row address strobe signal $\overline{RAS}$. Consequently, the sense amplifiers NSA and PSA are rendered inactive. The equalize signal $BLEQ_2$ rises to the "H" level in a constant time period, so that the potentials on the bit lines BL and $\overline{BL}$ are equalized. The word line driving signal $\phi WL_2$ rises to the "H" level in response to the fall of the equalize signal $BLEQ_2$. Thereafter, the sense amplifier activating signal $\phi S_{N2}$ attains the "H" level and the sense amplifier activating signal $\phi S_{P2}$ attains the "L" level, so that the sense amplifiers NSA and PSA are rendered active. Even if the word line driving signal $\phi WL_2$ falls to the "L" level so that the refresh operation is completed, the equalize signal $BLEQ_2$, the precharging signal $BLHD_2$, the sense amplifier activating signals $\phi S_{N2}$ and $\phi S_{P2}$ remain in the state.

Then, when the block 1 is selected by the row address signal $RA_8$ (n the time period ⑤ in FIG. 9A), the same refresh operation as that in the time period ④ is performed in the block 1. After the refresh operation is completed, the potentials on the bit lines BL and $\overline{BL}$ are not supplied to the bit line pair BL and $\overline{BL}$, and the sense amplifiers NSA and PSA remain at the active state, as in the case of time period ④.

The same refresh operation as that in the time period ③ or ④ is performed in the time periods ⑥ to ⑧.

As described above, since the precharge potential generating circuit 5 does not operate after the refresh operation is completed, the power consumption in the standby period is reduced.

When the refresh signal $\overline{REF}$ attains the "H" level, the refresh mode is completed and the normal mode is started. Consequently, in the blocks 1 and 2, the equalize signals $BLEQ_1$ and $BLEQ_2$ and the precharging signals $BLHD_1$ and $BLHD_2$ rise to the "H" level, the sense amplifier activating signals $\phi S_{N1}$ and $\phi S_{N2}$ attain the "L" level and the sense amplifier activating signals $\phi S_{P1}$ and $\phi S_{P2}$ attain the "H" level.

As described in the foregoing, since, in the normal mode, the potentials on the bit lines BL and $\overline{BL}$ are equalized and the precharge potential $V_{BL}$ is applied to the bit line pair BL and $\overline{BL}$ in the standby period, the potential on the bit line pair is held at $\frac{1}{2} \cdot V_{CC}$. Thus, in the active period, equalizing of the potentials on the bit lines BL and $\overline{BL}$ and supply of the precharge potential $V_{BL}$ are stopped in the selected block, so that the word line driving signal $\phi WL$ can be raised. Consequently, access is made at a high speed.

On the other hand, in the refresh mode, the potentials on the bit lines BL and $\overline{BL}$ are held at the "H" and "L" levels by the sense amplifiers NSA and PSA, so that the bit lines BL and $\overline{BL}$ are not equalized and the precharge potential $V_{BL}$ is not supplied. On this occasion, since the precharge potential generating circuit 5 is electrically disconnected from the power supply not to operate, the power consumption is reduced. In this case, in the active period, the bit lines BL and $\overline{BL}$ are equalized with the sense amplifiers NSA and PSA being rendered inactive in the selected block and then, the word line driving signal $\phi WL$ is raised, so that much time is required from the fall of the row address strobe signal $\overline{RAS}$ to the rise of the word line driving signal $\phi WL$. However, in the refresh mode, information is not read out and written, resulting in no problem.

FIGS. 10A to 15 are circuit diagrams showing specifically main portions of the clock generator 10 shown in FIG. 6.

Figure 10A:
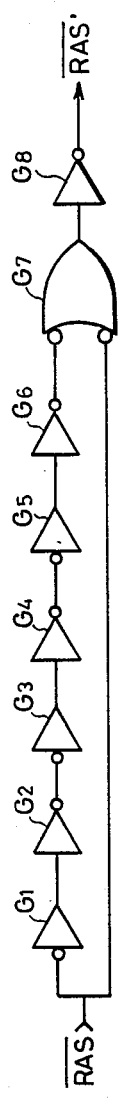
FIG. 10A is a diagram showing a circuit portion for generating an internal row address strobe signal $\overline{RAS'}$ in a clock generator included in the semiconductor memory device shown in FIG. 6.
Figure 10B:
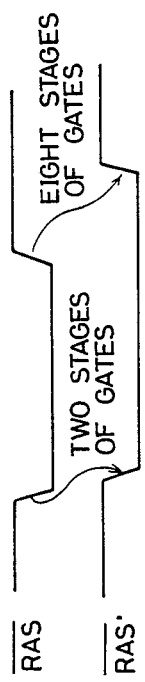
FIG. 10B is a waveform diagram for explaining operation of the circuit shown in FIG. 10A.

FIG. 10A is a diagram showing a circuit for generating an $\overline{RAS'}$ signal which is a clock of an RAS system used within a chip.

A logical gate G7 has one input terminal receiving a row address strobe signal $\overline{RAS}$ through six logical gates G1 to G6 and other input terminal directly receiving the row address strobe signal $\overline{RAS}$. An output of the logical gate G7 is inverted by a logical gate G8 and provided as an $\overline{RAS'}$ signal. The $\overline{RAS'}$ signal rises later than the row address strobe signal $\overline{RAS}$. More specifically, the fall of the $\overline{RAS'}$ signal is delayed, by two stages (G7 and G8) of logical gates, from the fall of the row address strobe signal $\overline{RAS}$, and the rise of the $\overline{RAS'}$ signal is delayed, by eight stages (G1 to G8) of logical gates, from the rise of the row address strobe signal $\overline{RAS}$ (see FIG. 10B).

Figure 11:
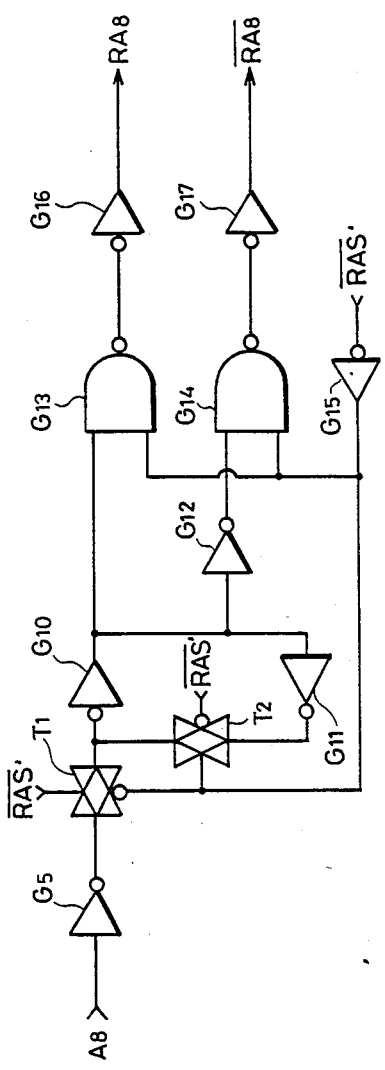
FIG. 11 is a diagram showing a circuit portion for generating an $RA_8$ signal and an $\overline{RA_8}$ signal in the same clock generator.

FIG. 11 is a diagram showing a circuit for generating an $RA_8$ signal and an $\overline{RA_8}$ signal used for selecting a block.

When the $\overline{RAS'}$ signal is at the "H" level, a signal at the "L" level is applied to respective one input terminals of logical gates G13 and G14 from a logical gate G15, so that outputs of the logical gates G13 and G14 attain the "H" level. Thus, both the $RA_8$ signal and the $\overline{RA_8}$ signal attain the "L" level. At that time, since a transfer gate T1 is turned on and a transfer gate T2 is turned off, an inverted signal of an address signal $A_8$ is inputted to a logical gate G10. At the falling time of the $\overline{RAS'}$ signal, the inverted signal of the address signal $A_8$ is latched in a latch circuit comprising logical gates G10 and G11. Either one of the outputs of the logical gates G13 and G14 attains the "L" level in response to a level of the inverted signal, so that either one of the $RA_8$ signal and the $\overline{RA_8}$ signal attains the "H" level. The $RA_8$ signal is applied to a block 1 and the $\overline{RA_8}$ signal is applied to a block 2.

Figure 12:
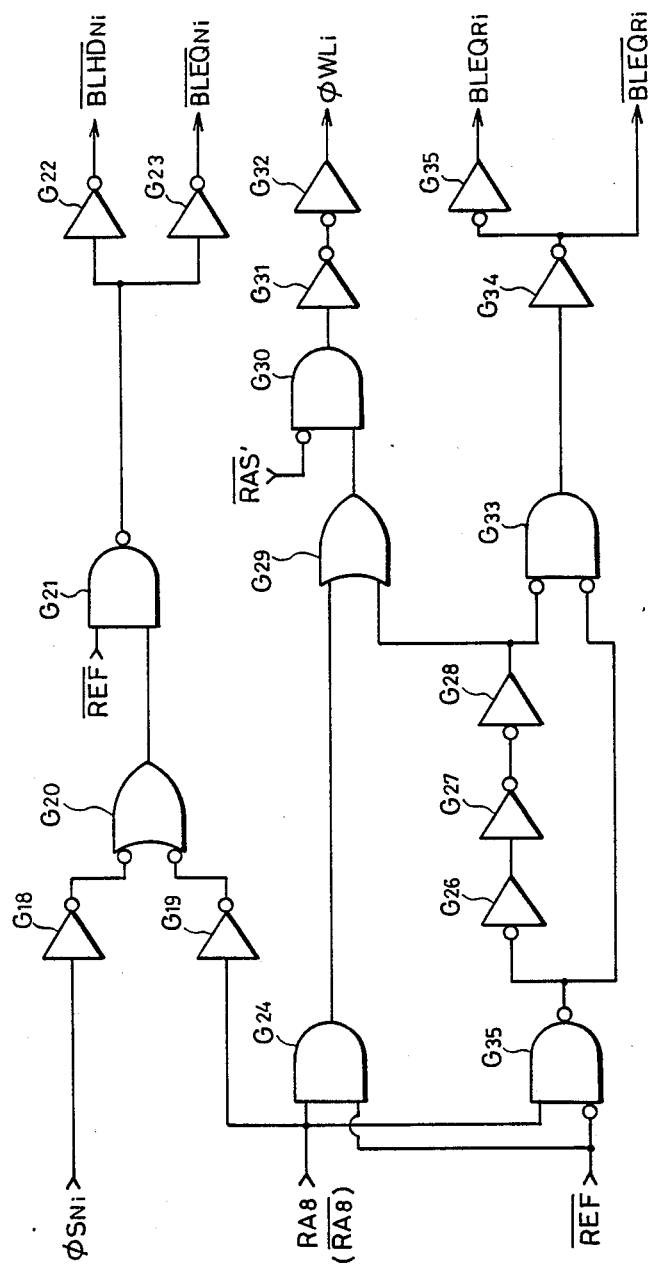
FIG. 12 is a diagram showing a circuit portion for mainly generating a word line driving signal $\phi WL_i$ in the same clock generator.

FIG. 12 is a diagram showing a circuit for generating a word line driving signal $\phi WL_i$, a $\overline{BLHD_{Ni}}$ signal, a $\overline{BLEQ_{Ni}}$ signal, a $BLEQ_{Ri}$ signal and a $\overline{BLEQ_{Ri}}$ signal. In a block 1 to which a $RA_8$ signal is applied, i is equal to 1, and in a block 2 to which a $\overline{RA_8}$ signal is applied, i is equal to 2.

At the time of the normal mode, i.e., when a refresh signal $\overline{REF}$ is at the "H" level, the $RA_8$ signal or the $\overline{RA_8}$ signal is outputted from a logical gate G24. In addition, an output of the logical gate G25 attains the "H" level. Consequently, the $RA_8$ signal or the $\overline{RA_8}$ signal is applied to one input terminal of a logical gate G29 and a signal at the "L" level is applied to the other input terminal thereof. Thus, when the $\overline{RAS'}$ signal is at the "L" level, the word line driving signal $\phi WL_i$ becomes a signal obtained by delaying the $RA_8$ signal or the $\overline{RA_8}$ signal by five stages of logical gates (G24, G29 to G32). Furthermore, at the time of the refresh mode, i.e., when the refresh signal $\overline{REF}$ is at the "L" level, an output of the logical gate G24 attains the "L" level. An inverted signal of the $RA_8$ signal or an inverted signal of the $\overline{RA_8}$ signal is outputted from the logical gate G25. Consequently, a signal at the "L" level is applied to one input terminal of the logical gate G29 and the $RA_8$ signal or the $\overline{RA_8}$ signal is applied to the other input terminal thereof. Thus, when the $\overline{RAS'}$ signal is at the "L" level, the word line driving signal $\phi WL_i$ becomes a signal obtained by delaying the $RA_8$ signal or the $\overline{RA_8}$ signal by eight stages of logical gates (G25 to G32). Thus, the rise of the word line driving signal $\phi WL_i$ at the time of the refresh mode is delayed from that at the time of the normal mode. The delay is equal to the width of the "H" level of the equalize signal $BLEQ_i$ at the time of the refresh mode (see FIG. 9).

Additionally, at the time of the refresh mode, i.e., when the refresh signal $\overline{REF}$ is at the "L" level, the inverted signal of the $RA_8$ signal or the inverted signal of the $\overline{RA_8}$ signal is outputted from the logical gate G25. When the $RA_8$ signal or the $\overline{RA_8}$ signal rises, one input of a logical gate G33 attains the "L" level, and the other input thereof attains the "H" level after the delay time determined by the logical gates G26 to G28. Consequently, an output of the logical gate G33 rises from the "L" level to the "H" level and falls to the "L" level after the above described delay time. Thus, the $BLEQ_{Ri}$ signal becomes a one-shot signal which remains at the "H" level only in a constant time period and then, attains the "L" level. In addition, the $\overline{BLEQ_{Ri}}$ signal is an inverted signal of the $BLEQ_{Ri}$ signal (see FIG. 16). At the time of the normal mode, i.e., when the refresh signal $\overline{REF}$ is at the "H" level, the output of the logical gate G25 attains the "H" level, so that the $\overline{BLEQ_{Ri}}$ signal attains the "H" level and the $BLEQ_{Ri}$ signal attains the "L" level.

Additionally, at the time of the normal mode, i.e., when the refresh signal $\overline{REF}$ is at the "H" level, a logical gate G21 inverts an output of a logical gate G20 to output the same. When a sense amplifier activating signal $\phi S_{Ni}$ is at the "L" level, the $RA_8$ signal or the $\overline{RA_8}$ signal is outputted from the logical gate G20 and the inverted signal of the $RA_8$ signal or the inverted signal of the $\overline{RA_8}$ signal is outputted from the logical gate G21. Thus, the $\overline{BLHD_{Ni}}$ signal and the $\overline{BLEQ_{Ni}}$ signal rise in response to the rise of the $RA_8$ signal or the $\overline{RA_8}$ signal. In addition, when the sense amplifier activating signal $\phi S_{Ni}$ attains the "H" level, the output of the logical gate G20 attains the "H" level. Thus, thereafter, even if the $RA_8$ signal or the $\overline{RA_8}$ signal falls to the "L" level, the $\overline{BLHD_{Ni}}$ signal and the $\overline{BLEQ_{Ni}}$ signal remain at the "H" level. The $\overline{BLHD_{Ni}}$ signal and the $\overline{BLEQ_{Ni}}$ signal fall in response to the fall of the sense amplifier activating signal $\phi S_{Ni}$ (see FIG. 16). At the time of the refresh mode, i.e., when the refresh signal $\overline{REF}$ is at the "L" level, the output of the logical gate G21 attains the "H" level, so that the $\overline{BLHD_{Ni}}$ signal and the $\overline{BLEQ_{Ni}}$ signal attain the "L" level.

Figure 13B:
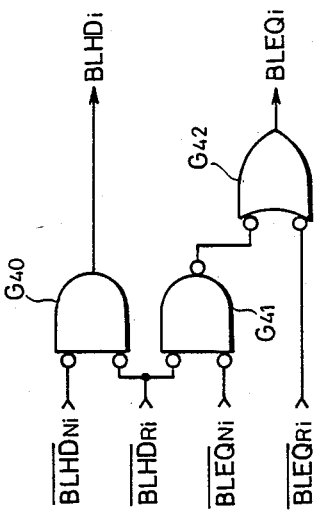
FIG. 13B is a diagram showing circuit structure of the flip-flop shown in FIG. 13A in detail.
Figure 13A:
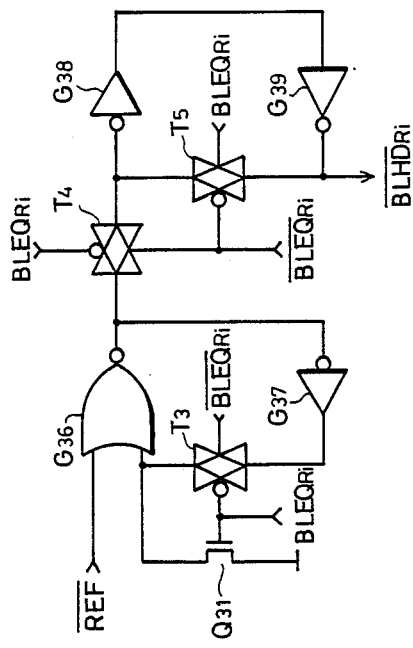
FIG. 13A is a diagram showing a flip-flop for generating a $\overline{BLHD_{Ri}}$ in the same clock generator.

FIG. 13A is a diagram showing a circuit for generating a $\overline{BLHD_{Ri}}$ signal.

In FIG. 13A, the refresh signal $\overline{REF}$ is applied to a set terminal S of a D flip-flop DF. The $\overline{BLEQ_{Ri}}$ signal generated from the circuit shown in FIG. 12 is applied to a data input terminal D and the $\overline{BLHD_{Ri}}$ signal is outputted from a data output terminal $\overline{Q}$. When the refresh signal $\overline{REF}$ is at the "H" level, the $\overline{BLHD_{Ri}}$ signal attains the "L" level. When the refresh signal $\overline{REF}$ attains the "L" level, the $\overline{BLHD_{Ri}}$ signal rises in response to the rise of the $\overline{BLEQ_{Ri}}$ signal while falling falls in response to the rise of the refresh signal $\overline{REF}$ (see FIG. 16).

FIG. 13B is a circuit diagram of the circuit shown in FIG. 13A in detail.

In FIG. 13B, when the refresh signal $\overline{REF}$ is at the "L" level, a logical gate G36 operates as an inverter. When the $BLEQ_{Ri}$ signal is at the "H" level and the $\overline{BLEQ_{Ri}}$ signal is at the "L" level, an MOS transistor Q31 is turned on, so that an output of the logical gate G36 attains the "H" level. At that time, transfer gates T3 and T4 are turned off and a transfer gate T5 is turned on. When the $BLEQ_{Ri}$ signal attains the "L" level and the $\overline{BLEQ_{Ri}}$ signal attains the "H" level, the transfer gates T3 and T4 are turned on and the transfer gate T5 is turned off. Consequently, the output at the "H" level of the logical gate G36 is latched in a latch circuit comprising logical gates G36 and G37 and outputted through logical gates G38 and G39. Thus, the $\overline{BLHD_{Ri}}$ signal rises to the "H" level. In this state, when the refresh signal $\overline{REF}$ attains the "H" level, the output of the logical gate G36 attains the "L" level. Thus, the $\overline{BLHD_{Ri}}$ signal falls to the "L" level (see FIG. 16).

Figure 14:
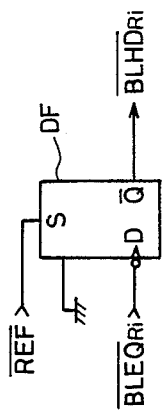
FIG. 14 is a diagram showing a circuit portion for generating a precharging signal $BLHD_i$ and an equalize signal $BLEQ_i$ in the same clock generator.

FIG. 14 is a diagram showing a circuit for generating an equalize signal $BLEQ_i$ and a precharging signal $BLHD_i$.

The $\overline{BLHD_{Ni}}$ signal is applied to one input terminal of a logical gate G40 and the $\overline{BLHD_{Ri}}$ signal is applied to the other input terminal thereof. The precharging signal $BLHD_i$ is derived from an output terminal of the logical gate G40. The $\overline{BLHD_{Ri}}$ signal is applied to one input terminal of a logical gate G41 and the $\overline{BLEQ_{Ni}}$ signal is applied to the other input terminal thereof. An output of the logical gate G41 is applied to one input terminal of a logical gate G42 and the $\overline{BLEQ_{Ri}}$ signal is applied to the other input terminal thereof. The equalize signal $BLEQ_i$ is derived from an output terminal of the logical gate G42.

Figure 16:
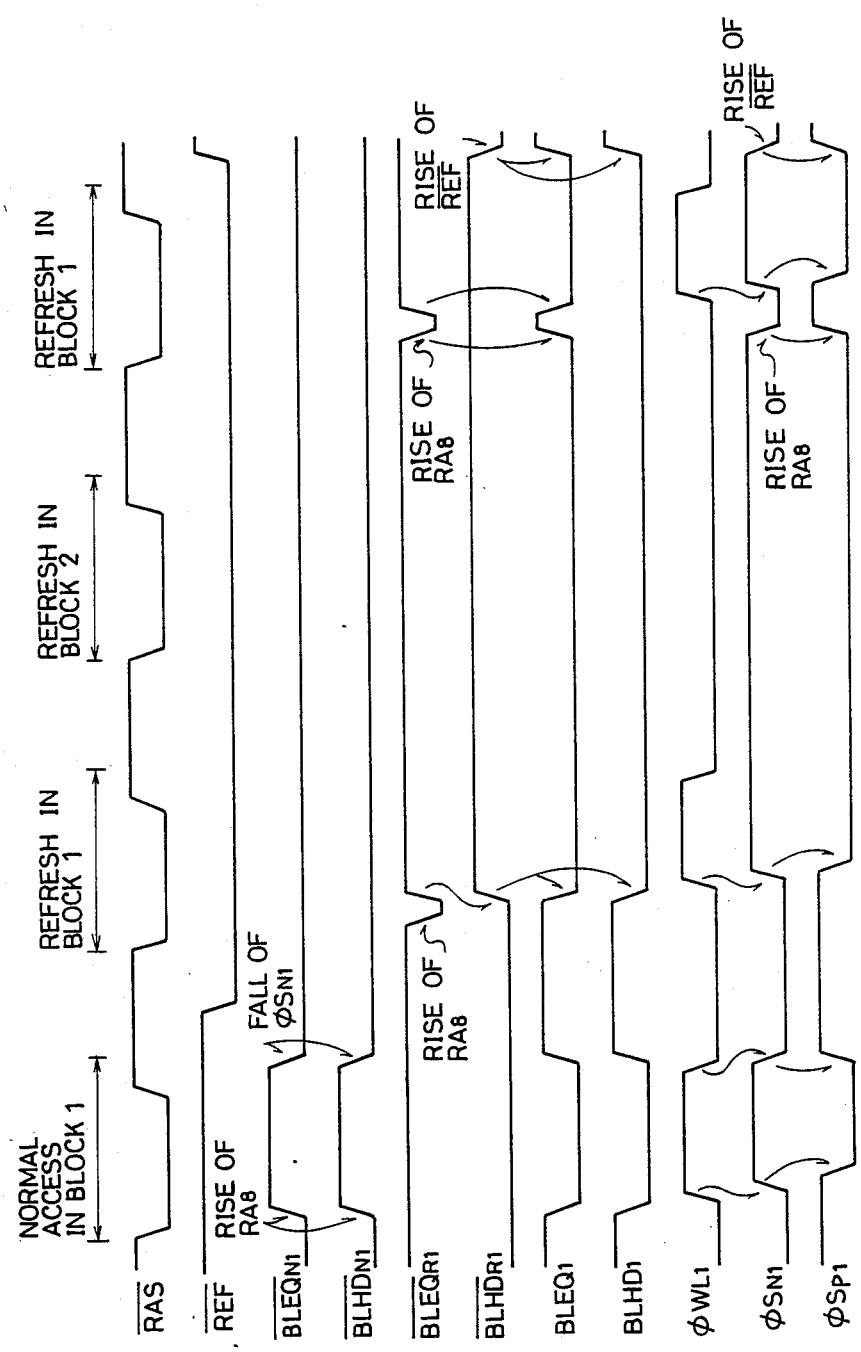
FIG. 16 is a waveform diagram for explaining operation of shown in FIGS. 12 to 15.

In the above described manner, at the time of the normal mode, the precharging signal $BLHD_i$ falls after the row address strobe signal $\overline{RAS}$ falls while rising after the row address strobe signal $\overline{RAS}$ rises, as shown in FIG. 16. In addition, at the time of the refresh mode, the precharging signal $BLHD_i$ falls after the row address strobe signal $\overline{RAS}$ falls and then, remains at the "L" level until it enters the normal mode.

On the other hand, at the time of the normal mode, the equalize signal $BLEQ_i$ falls after the row address strobe signal $\overline{RAS}$ falls while rising after the row address strobe signal $\overline{RAS}$ rises. In addition, at the time of the refresh mode, the equalize signal $BLEQ_i$ falls after the row address strobe signal $\overline{RAS}$ falls and remains at the "L" level until the time of the next refresh mode in the same block or the normal mode. At the time of the next refresh mode, the equalize signal $BLEQ_i$ is at the "H" level during a constant time period after the row address strobe signal $\overline{RAS}$ falls and attains the "L" level again. At the time of the normal mode again, the equalize signal $BLEQ_i$ attains the "H" level in response to the rise of the refresh signal $\overline{REF}$.

Figure 15:
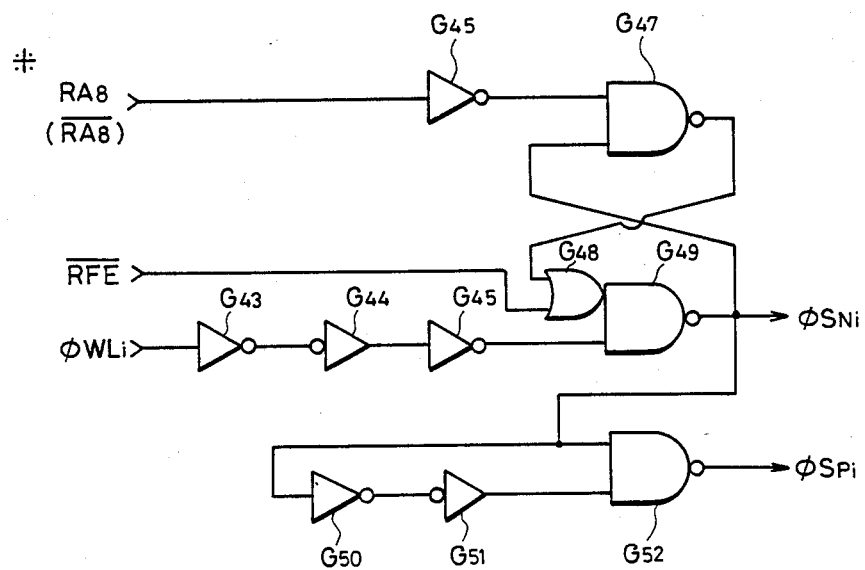
FIG. 15 is a diagram showing a circuit portion for generating sense amplifier activating signals $\phi S_{Ni}$ and $\phi S_{Pi}$ in the generator.

FIG. 15 is a diagram showing a circuit for generating sense amplifier activating signals $\phi S_{Ni}$ and $\phi S_{Pi}$.

At the time of the normal mode, i.e., when a refresh signal $\overline{REF}$ is at the "H" level, a logical gate G49 operates as an inverter. Thus, the sense amplifier activating signal $\phi S_{Ni}$ becomes a signal obtained by delaying a word line driving signal $\phi WL_i$ by four stages of logical gates (G43 to G45 and G49). At the time of the refresh mode, i.e., when the refresh signal $\overline{REF}$ is at the "L" level, the logical gates G47 and G49 operate as an $\overline{RS}$ flip-flop. Thus, the sense amplifier activating signal $\phi S_{Ni}$ rises after the delay from the rise of the word line driving signal $\phi WL_i$ while falling after the delay from an $RA_8$ signal or an $\overline{RA_8}$ signal, as shown in FIG. 16. The sense amplifier activating signal $\phi S_{Pi}$ rises in response to the fall of the sense amplifier activating signal $\phi S_{Ni}$.

Figure 17:
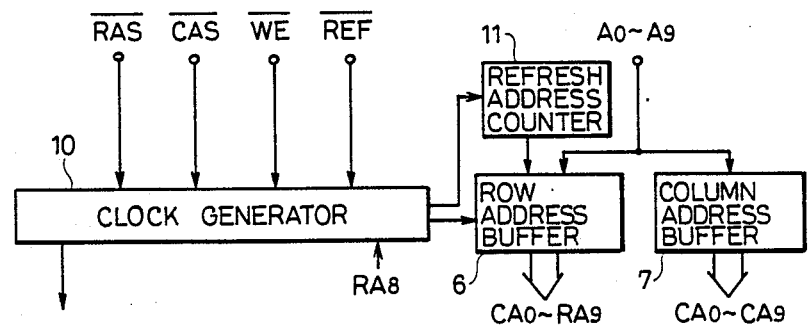
FIG. 17 is a diagram showing structure of main portions of a semiconductor memory device according to another the present invention.

FIG. 17 is a diagram showing main portions of a semiconductor memory device according to another embodiment of the present invention.

The semiconductor memory device according to the present embodiment contains a refresh address counter 11. An address signal at the time of a refresh operation is applied by the refresh address counter 11, the value of the refresh address counter 11 being incremented every time the refresh operation is performed. Thus, an address signal for the refresh operation need not be applied from the exterior but is automatically generated inside of the semiconductor memory device. Since a refresh address is determined in advance by the refresh address counter 11, the refresh operation at the time of the refresh mode can be performed at the same timing as at the normal mode.

Figure 18:
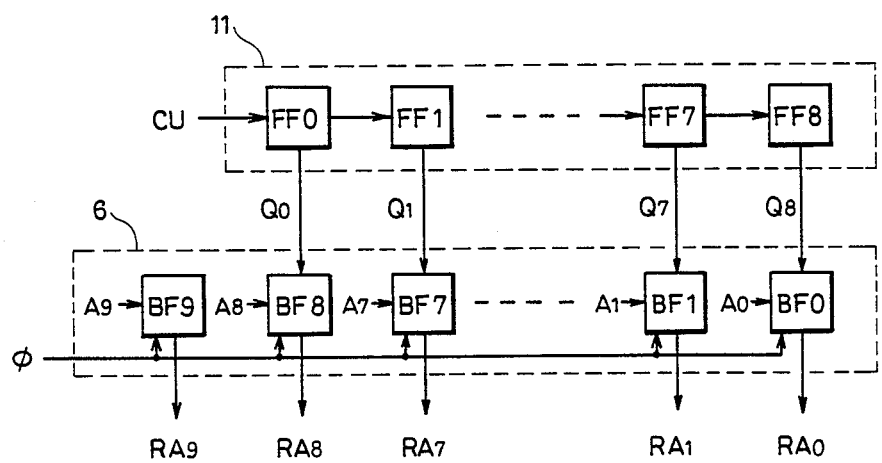
FIG. 18 is a diagram showing structure of a refresh address counter included in the semiconductor memory device shown FIG. 17.

FIG. 18 is a diagram showing structure of the refresh address counter 11 and a row address buffer 6 included in FIG. 17.

The refresh address counter 11 comprises nine flip-flops FF0 to FF8, the flip-flops FF0 to FF8 being incremented in the order, beginning with the lowest order flip-flop FF0 in response to a pulse signal CU applied from a clock generator 10. The row address buffer 6 comprises ten buffer circuits BF0 to BF9. Output signals $Q_0$ to $Q_8$ of the flip-flops FF0 to FF8 in the refresh address counter 11 are applied to buffer circuits BF8 to BF0 in the row address buffer 6, respectively. At the time of normal access, the row address buffer 6 outputs address signals $A_0$ to $A_9$ applied from the exterior as row address signals $RA_0$ to $RA_9$, respectively, in response to the command from the clock generator 10. At the time of a refresh operation, the row address buffer 6 outputs the output signals $Q_8$ to $Q_0$ from the refresh address counter 11 as the row address signals $RA_0$ to $RA_8$, respectively.

Meanwhile, at the time of the refresh operation, the output signal $Q_0$ of the least significant bit of the refresh address counter 11 is outputted as the row address signal $RA_8$. Since the row address signal $RA_8$ is used for selecting blocks, blocks 1 and 2 are alternately selected.

In this case, the time period during which a precharge potential generating circuit 5 does not operate is the longest, so that the power consumption is best reduced.

Figure 19:
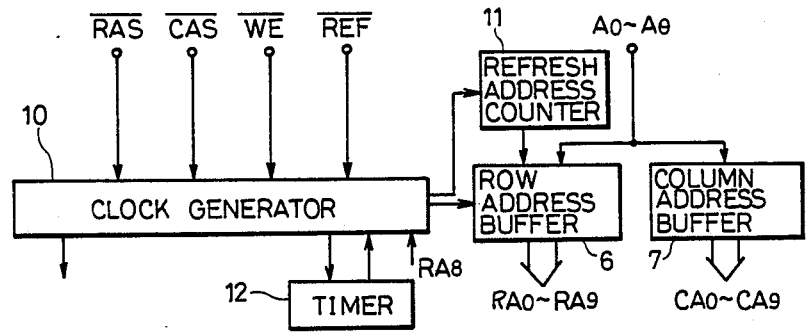
FIG. 19 is a diagram showing structure of main portions of a semiconductor memory device according to still another embodiment of the present invention.

FIG. 19 is a diagram showing main portions of a semiconductor memory device according to still another embodiment of the present invention.

In the present embodiment, a timer 12 is provided in addition to the main portions in the embodiment shown in FIG. 17. At the time of a refresh mode, the timer 12 lowers an internal row address strobe signal $\overline{RAS}$ to an "L" level every constant time period after the fall of the internal row address strobe signal $\overline{RAS}$. Consequently, a refresh operation is automatically performed at constant time intervals.

The semiconductor memory device containing the timer is described in, for example, an article entitled "64Kbit MOS Dynamic RAM Containing Auto/Self Refresh Function", Journal of Institute of Electronics and Communication Engineers of Japan, Vol. J66-C, No. 1, Jan. 1983, pp. 62–69.

Figure 20:
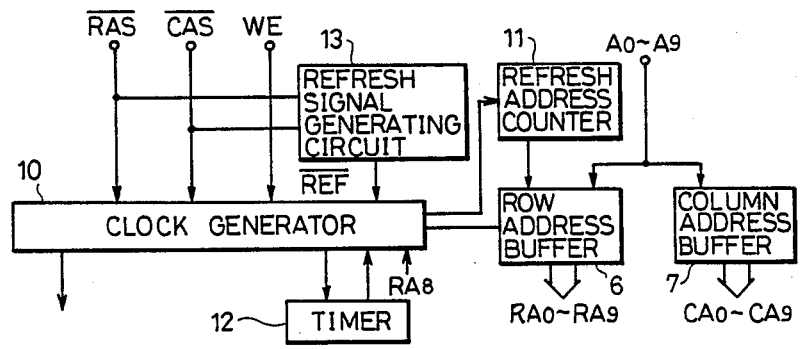
FIG. 20 is a diagram showing structure of main portions of a semiconductor memory device according to yet another embodiment of the present invention.

FIG. 20 is a diagram showing main portions of a semiconductor memory device according to yet another embodiment of the present invention.

In the embodiments shown in FIGS. 6, 17 and 19, the refresh signal $\overline{REF}$ is applied from the exterior. On the other hand, in the present embodiment, the refresh signal $\overline{REF}$ is applied from a refresh signal generating circuit 13. The refresh signal generating circuit 13 generates the refresh signal $\overline{REF}$ in response to a row address strobe signal $\overline{RAS}$ and a column address strobe signal $\overline{CAS}$. The refresh signal generating circuit 13 changes the refresh signal $\overline{REF}$ from an "H" level to an "L" level if the column address strobe signal $\overline{CAS}$ has already been at the "L" level at the time point when the row address strobe signal $\overline{RAS}$ falls to the "L" level, for example ($\overline{CAS}$ before $\overline{RAS}$ refresh operation).

As described in the foregoing, according to the above described embodiments, the access operation is performed at a high speed at the time of the normal mode and the power consumption is reduced at the time of the refresh mode.

Although in the above described embodiments, the refresh operation in the refresh mode is controlled by the refresh signal $\overline{REF}$ and the row address strobe signal $\overline{RAS}$, the refresh operation may be controlled by only the refresh signal $\overline{REF}$ applied to an $\overline{REF}$ terminal as in some 64Kbit DRAMs. In addition, the refresh operation may be controlled by the $\overline{CAS}$ before $\overline{RAS}$ refresh operation widely used in a 256Kbit DRAM, a 1Mbit DRAM or the like. Furthermore, the refresh operation may be controlled by a method using the level of a signal applied to another external terminal and a timing sequence and the other methods.

Additionally, it should be noted that the structure of the precharging signal generating circuit 5 is not limited to the structure shown in FIG. 8. For example, the precharging signal generating circuit 5 may be of another structure having a power-down function.

As described in the foregoing, according to the present invention, access is made at a high speed at the time of the normal mode and the power consumption is reduced at the time of the refresh mode. Thus, a semiconductor memory device is obtained in which access is not delayed and the power consumption is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device, comprising:
    a memory cell array divided into a plurality of blocks, each of said blocks comprising
        a plurality of memory cells arranged in a plurality of rows and columns,
        a plurality of word lines each provided corresponding to each row of said plurality of memory cells and used for selecting the memory cells in the row,
        a plurality of bit line pairs each provided corresponding to each column of said plurality of memory cells and used for writing information to the memory cells in each column or reading out information stored in the memory cells in the column,
        a plurality of sense amplifiers each connected to each of said bit line pairs for amplifying a potential on the bit line pair to a first potential and a second potential, respectively, and
        a plurality of equalizing means each connected to each of said bit line pairs for equalizing a potential on the bit line pair,
    block selecting means for selecting any of said plurality of blocks;
    intermediate potential generating means for generating an intermediate potential between said first potential and said second potential and applying the same to each of said bit line pairs;
    mode defining means for providing a first mode control signal defining a normal mode and a second mode control signal defining a refresh mode; and
    control means responsive to said first mode control signal defining a normal mode for
        (a) rendering inactive said sense amplifiers included in a block selected by said block selecting means; and
        (b) rendering active said equalizing means and said intermediate potential generating means included in the selected block after an access operation in the block is completed;
    said control means further responsive to said second mode control signal defining a refresh mode for, prior to starting of the refresh mode
        (a) holding active said sense amplifiers included in a block selected by said block selecting means and rendering inactive said equalizing means and said intermediate potential generating means included in the selected block after a refresh operation in the block is completed; and
        (b) rendering inactive said sense amplifiers included in the block immediately before the next refresh operation is performed in the block, rendering said equalizing means active for a predetermined short period of time.

2. A dynamic semiconductor memory device according to claim 1, wherein in said refresh mode, only a refresh operation of information is performed and read and write operations of information are not performed.

3. A dynamic semiconductor memory device according to claim 1, wherein said first mode control signal is a first level of a refresh signal externally applied, and said second mode control signal is a second level of said refresh signal.

4. A dynamic semiconductor memory device according to claim 1, wherein said mode defining means comprises refresh signal generating means for generating a refresh signal, said first mode control signal is a first level of said refresh signal, and said second mode control signal is a second level of said refresh signal.

5. A dynamic semiconductor memory device according to claim 1, wherein said control means comprises timer means for automatically starting a refresh operation at constant time intervals.

6. A dynamic semiconductor memory device according to claim 1, wherein said intermediate potential generating means comprises an intermediate potential output terminal for said intermediate potential, a first supply terminal coupled to said first potential, a second supply terminal coupled to said second potential, a plurality of first switching means connected between said intermediate potential output terminal and said plurality of bit line pairs and second switching means connected between said first supply terminal and said first potential or between said second supply terminal and said second potential, said first switching means and said second switching means being rendered conductive at the time of said active state while being rendered non-conductive at the time of said inactive state.

7. A dynamic semiconductor memory device according to claim 1, which further comprises row selecting means responsive to a part of a plurality of address signals externally applied for selecting one of said plurality of word lines in each of said blocks, and wherein said block selecting means selects any of said plurality of blocks in response to another part of said plurality of address signals.

8. A dynamic semiconductor memory device according to claim 5, wherein said row selecting means and said block selecting means comprise a row address buffer and a column address buffer.

9. A dynamic semiconductor memory device according to claim 1, which further comprises refresh address generating means for generating a plurality of refresh address signals at the time of the refresh operation in said refresh mode, and row selecting means responsive to a part of a plurality of address signals externally applied for selecting one of said plurality of word lines in each of said blocks at the time of the access operation in said normal mode, and responsive to a part of said plurality of refresh address signals generated by said refresh address generating means for selecting one of said plurality of word lines at the time of the refresh operation in said refresh mode, and wherein said block selecting means selects any of said plurality of blocks in response to another part of said plurality of address signals externally applied at the time of the access operation in said normal mode, and selects any of said plurality of blocks in response to another part of said plurality of refresh address signals generated by said refresh address generating means at the time of the refresh operation in said refresh mode.

10. A dynamic semiconductor memory device according to claim 9, wherein said refresh address generating means comprises a counter having outputs of a plurality of bits, and said block selecting means selects any of said plurality of blocks in response to an output of the least significant bit out of said plurality of bits at the time of the refresh operation in the refresh mode.

11. A dynamic semiconductor memory device according to claim 7, wherein said row selecting means and said block selecting means comprise a row address buffer and a column address buffer.

12. An operating method for a dynamic semiconductor memory device, which includes:

a memory cell array divided into a plurality of blocks, each of said blocks comprising a plurality of memory cells arranged in a plurality of rows and columns, a plurality of word lines each provided corresponding to each row of said plurality of memory cells and used for selecting the memory cells in the row, a plurality of bit line pairs each provided corresponding to each column of said plurality of memory cells and used for writing information to the memory cells in each column or reading out information stored in the memory cells in the column, a plurality of sense amplifiers each connected to each of said bit line pairs for amplifying a potential on the bit line pair to a first potential and a second potential, respectively, and a plurality of equalizing means each connected to each of said bit line pairs for equalizing a potential on the bit line pair, block selecting means for selecting any of said plurality of blocks;

intermediate potential generating means for generating an intermediate potential between said first potential and said second potential and applying the same to each of said bit line pairs;

said operating method comprising the steps of:

generating a first mode control signal defining a normal mode and a second mode control signal defining a refresh mode;

in response to said first control signal defining a normal mode (a) rendering inactive said sense amplifiers included in a block selected by said block selecting means; and (b) rendering active said equalizing means and said intermediate potential generating means included in the selected block after an access operation in the block is completed; and in response to said second mode control signal defining a refresh mode, prior to starting of the refresh mode (a) holding active said sense amplifiers included in a block selected by said block selecting means and rendering inactive said equalizing means and said intermediate potential generating means included in the selected block after a refresh operation in the block is completed; and (b) rendering inactive said sense amplifiers included in the block immediately before the next refresh operation is performed in the block, rendering said equalizing means active for a predetermined short period of time.

* * * * *

UNITED STATES PATENT AND TRADEMARK OFFICE
CERTIFICATE OF CORRECTION

PATENT NO.   : 4,907,199
DATED        : March 6, 1990
INVENTOR(S)  : Katsumi DOSAKA et al.

It is certified that error appears in the above-identified patent and that said Letters Patent is hereby corrected as shown below:

Please correct the spelling of the title as follows:

DYNAMIC SEMICONDUCTOR MEMORY DEVICE AND METHOD FOR CONTROLLING THE PRECHARGE/REFRESH AND ACCESS MODES THEREOF

Signed and Sealed this

Twenty-third Day of April, 1991

Attest:

HARRY F. MANBECK, JR.

*Attesting Officer*   *Commissioner of Patents and Trademarks*